(12) United States Patent
Horiguchi

(10) Patent No.: US 9,627,218 B2
(45) Date of Patent: Apr. 18, 2017

(54) PATTERN FORMING METHOD AND MANUFACTURING METHOD FOR SEMICONDUCTOR DEVICE

(71) Applicant: Kabushiki Kaisha Toshiba, Minato-ku (JP)

(72) Inventor: Kazunori Horiguchi, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 22 days.

(21) Appl. No.: 14/729,474

(22) Filed: Jun. 3, 2015

(65) Prior Publication Data

US 2016/0247687 A1    Aug. 25, 2016

(30) Foreign Application Priority Data

Feb. 24, 2015  (JP) ................................. 2015-033986

(51) Int. Cl.

| | | |
|---|---|---|
| *H01L 21/311* | (2006.01) | |
| *H01L 21/308* | (2006.01) | |
| *H01L 21/027* | (2006.01) | |
| *H01L 21/033* | (2006.01) | |
| *G03F 7/00* | (2006.01) | |

(52) U.S. Cl.
CPC ........ *H01L 21/3086* (2013.01); *G03F 7/0002* (2013.01); *H01L 21/0273* (2013.01); *H01L 21/0332* (2013.01); *H01L 21/0337* (2013.01); *H01L 21/31144* (2013.01)

(58) Field of Classification Search
CPC ........... H01L 21/31144; H01L 21/0337; H01L 21/20; H01L 21/203; H01L 21/28061; H01L 21/28194; H01L 21/28229
USPC .......................................... 257/435; 438/703
See application file for complete search history.

(56) References Cited

U.S. PATENT DOCUMENTS

| | | | |
|---|---|---|---|
| 2005/0069732 A1* | 3/2005 | Kamata .................. | B82Y 10/00 428/835 |
| 2007/0217075 A1* | 9/2007 | Kamata .................. | B82Y 10/00 360/135 |
| 2008/0258250 A1* | 10/2008 | Uenishi ............. | H01L 27/14625 257/432 |
| 2014/0024217 A1* | 1/2014 | Ohtsu .................... | B82Y 10/00 438/694 |
| 2015/0060955 A1* | 3/2015 | Chen .................... | H04R 19/005 257/254 |

FOREIGN PATENT DOCUMENTS

| | | |
|---|---|---|
| JP | 7-321091 A | 12/1995 |
| JP | 2720404 B2 | 3/1998 |
| JP | 5634313 B2 | 12/2014 |

* cited by examiner

*Primary Examiner* — Jami M Valentine
(74) *Attorney, Agent, or Firm* — Oblon, McClelland, Maier & Neustadt, L.L.P.

(57) ABSTRACT

According to one embodiment, a mask material is formed on a processing layer, a mask pattern with a top surface and a bottom surface is formed on the mask material, a protective film is formed on the top surface of the mask pattern, and after the formation of the protective film, the bottom surface of the mask pattern is etched in a depth direction.

20 Claims, 4 Drawing Sheets

PATTERN FORMING METHOD AND MANUFACTURING METHOD FOR SEMICONDUCTOR DEVICE

CROSS-REFERENCE TO RELATED APPLICATIONS

This application is based upon and claims the benefit of priority from Japanese Patent Application No. 2015-33986, filed on Feb. 24, 2015; the entire contents of which are incorporated herein by reference.

FIELD

Embodiments described herein relate generally to a pattern forming method and manufacturing method for semiconductor device.

BACKGROUND

As semiconductor devices have been more finely manufactured, resist patterns have also become finer. The resist patterns have been made finer and thinner to make it difficult to maintain sufficient etching resistance of the resist patterns, which bringing about reduction of processing accuracy in an etching process.

DETAILED DESCRIPTION

In general, according to one embodiment, a mask material is formed on a processing layer, a mask pattern with a top surface and a bottom surface is formed on the mask material, a protective film is formed on the top surface of the mask pattern, and after the formation of the protective film, the bottom surface of the mask pattern is etched in a depth direction.

Exemplary embodiments of a pattern forming method and a manufacturing method for a semiconductor device will be explained below in detail with reference to the accompanying drawings. The present invention is not limited to the following embodiments.

First Embodiment

FIGS. 1A to 1D and 2A to 2D are cross-sectional views illustrating a manufacturing method for a semiconductor device according to a first embodiment.

Figure 1A:
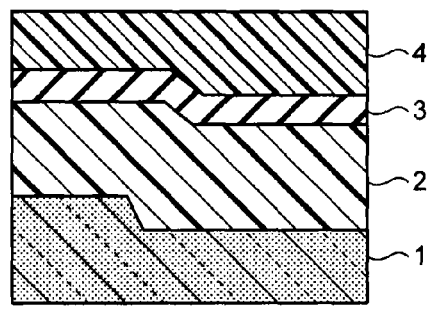
FIGS. 1A to 1D are cross-sectional views illustrating a manufacturing method for a semiconductor device according to a first embodiment.

Referring to FIG. 1A, an SOC (Spin On Carbon) film 2 is formed on a foundation layer 1 by a method such as spin coating. The foundation layer 1 may be a semiconductor substrate or a wiring layer. The foundation layer 1 may have a step. Then, an SOG (Spin On Glass) film 3 is formed on the SOC film 2 by a method such as spin coating. Then, an imprint material 4 is applied to the SOG film 3 via a nozzle. The imprint material 4 may be an ultraviolet curable resin, for example.

Figure 1B:
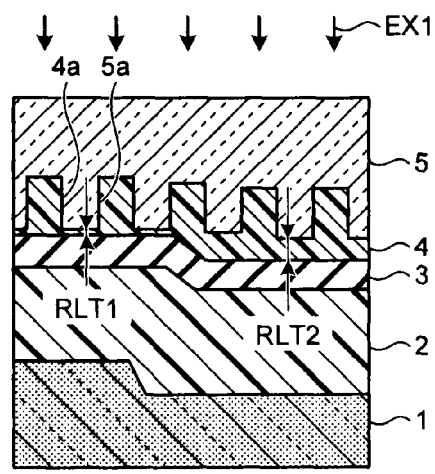

Next, as illustrated in FIG. 1B, while a template 5 is pressed against the imprint material 4, the imprint material 4 is irradiated with ultraviolet rays EX1 and then cured to form an imprint pattern 4a. The template 5 has a concave pattern 5a. The concave pattern 5a is transferred to the imprint material 4 to form the imprint pattern 4a with a top surface and a bottom surface on the imprint material 4. The material for the template 5 may be quartz, for example. When the foundation layer 1 has a step, film thickness RLT2 of the bottom surface of the imprint pattern 4a on the lower surface of the step is larger than film thickness RLT1 of the bottom surface of the imprint pattern 4a on the upper surface of the step.

Figure 1C:
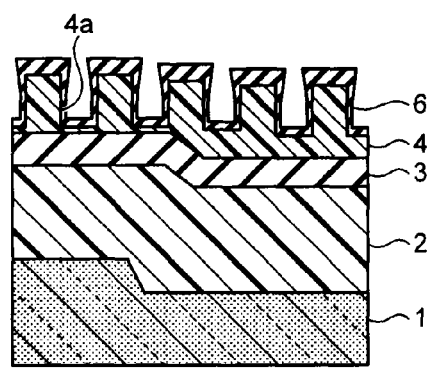

Next, as illustrated in FIG. 1C, a protective film 6 is formed along convexities and concavities of the imprint pattern 4a by a method such as ALD (Atomic Layer Deposition) or CVD. At that time, the protective film 6 may be formed to have an overhang shape and made thicker on the top surface than on the bottom surface of the imprint pattern 4a. For example, the ratio of thicknesses of the protective film 6 on the bottom surface to the top surface of the imprint pattern 4a may be set to 1 to 2. At that time, even when the bottom surface of the imprint pattern 4a is over-etched by 30%, the protective film 6 may be left on the top surface of the imprint pattern 4a. To form the protective film 6 in an overhang shape, film forming conditions for the protective film 6 may be set such that the embedding property of the protective film 6 is low. For example, the film forming condition for the protective film 6 may be set such that the coverage of the protective film 6 accounts for 50 to 60%. The material for the protective film 6 may be lower in etch rate than the imprint material 4. For example, when the imprint material 4 is an organic film, the protective film 6 may be an inorganic film of $SiO_2$ or SiN. The film forming temperature for the protective film 6 may be set to be equal to or lower than the baking temperature for the imprint material 4. For example, when the protective film 6 is to be formed from SiN by CVD, the film forming temperature may be set within the range of 70 to 80° C.

Figure 1D:
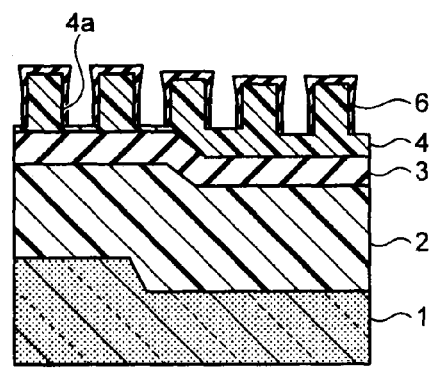

Next, as illustrated in FIG. 1D, the protective film 6 is etched back by anisotropic etching such as RIE. At that time, the protective film 6 may be removed from the bottom surface of the imprint pattern 4a while the protective film 6 is left on the top surface of the imprint pattern 4a.

Figure 2A:
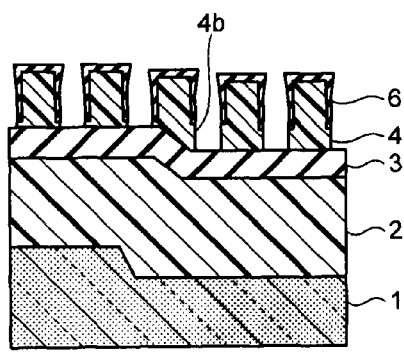
FIGS. 2A to 2D are cross-sectional views illustrating the manufacturing method for a semiconductor device according to the first embodiment.

Next, as illustrated in FIG. 2A, the imprint material 4 is etched in the depth direction by anisotropic etching such as RIE to penetrate through the bottom surface of the imprint pattern 4a, thereby to form openings 4b in the imprint pattern 4a. The film thickness RLT2 of the bottom surface of the imprint pattern 4a on the lower surface of the step is larger than the film thickness RLT1 of the bottom surface of the imprint pattern 4a on the upper surface of the step. Therefore, even though the bottom surface of the imprint pattern 4a comes off from the upper surface of the step, the imprint material 4 is continuously etched until the bottom surface of the imprint pattern 4a comes off from the bottom surfaces of the steps. At that time, covering the top surface of the imprint pattern 4a with the protective film 16 makes it possible to prevent dropping of shoulders of the top surface of the imprint pattern 4a on the upper surface of the step, even though the imprint material 4 is continuously etched after the bottom surface of the imprint pattern 4a comes off from the upper surface of the step. Accordingly, after the formation of the imprint pattern 4a, the imprint material 4 can be etched to remove the imprint material 4 on the bottom surface of the imprint pattern 4a while the shape of the imprint pattern 4a is maintained.

Figure 2B:
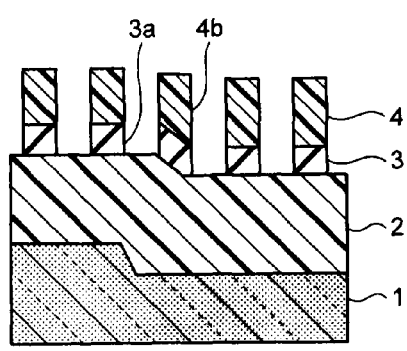

Next, as illustrated in FIG. 2B, the protective film 6 is removed from the imprint material 4. Then, the SOG film 3 is etched via the openings 4b to form openings 3a in the SOG film 3. Alternatively, the SOG film 3 may be etched without removal of the protective film 6 from the imprint material 4. In that case, however, it is preferred to decide designed dimensions of the imprint pattern 4a such that the imprint pattern 4a is set back by the film thickness of the protective film 6 in the process of FIG. 1A.

Figure 2C:
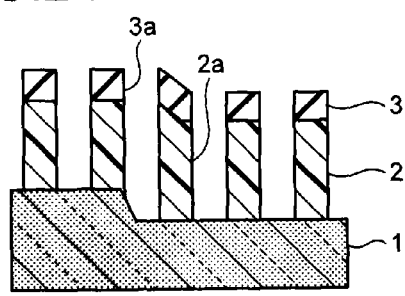

Next, as illustrated in FIG. 2C, the SOC film 2 is etched via the openings 3a to form openings 2a in the SOC film 2.

Figure 2D:
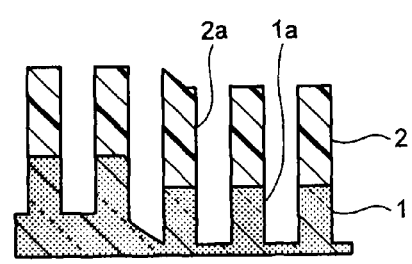

Next, as illustrated in FIG. 2D, the foundation layer 1 is etched via the openings 2a to form openings 1a in the foundation layer 1. The openings 1a may be used as contact holes, or may be used for STI (Shallow Trench Isolation) or for embedded wiring.

In the foregoing embodiment, the SOC film 2 and the SOG film 3 are formed on the foundation layer 1 to process the foundation layer 1. Alternatively, the SOC film 2 and the SOG film 3 may not be formed on the foundation layer 1 but the foundation layer 1 may be processed with the use of the imprint pattern 4a.

Second Embodiment

FIGS. 3A to 3E and 4A to 4D are cross-sectional views illustrating a manufacturing method for a semiconductor device according to a second embodiment.

Figure 3A:
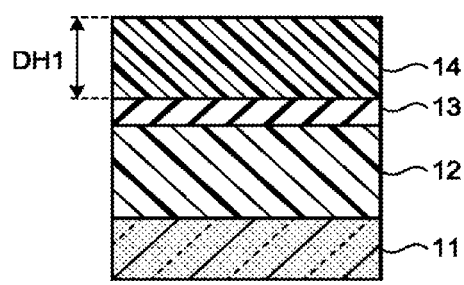
FIGS. 3A to 3E are cross-sectional views illustrating a manufacturing method for a semiconductor device according to a second embodiment.
Figure 3B:
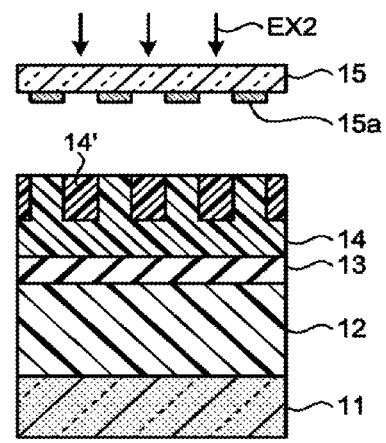

Referring to FIG. 3A, an SOC film 12 is formed on a foundation layer 11 by a method such as spin coating. Next, an SOG film 13 is formed on the SOC film 12 by a method such as spin coating. A resist material 14 is applied to the SOG film 13 by a method such as spin coating. At that time, film thickness DH1 of the resist material 14 may be set to 50 nm or more. Then, as illustrated in FIG. 3B, the resist material 14 is irradiated with exposure light EX2 via an exposure mask 15 to form a latent image 14' on the resist material 14. The exposure light EX2 may be EUV (extreme ultraviolet) light, for example. The exposure mask 15 has a light-shielding pattern 15a. Then, the light-shielding pattern 15a is transferred to the resist material 14 to form the latent image 14' on the resist material 14.

Figure 3C:
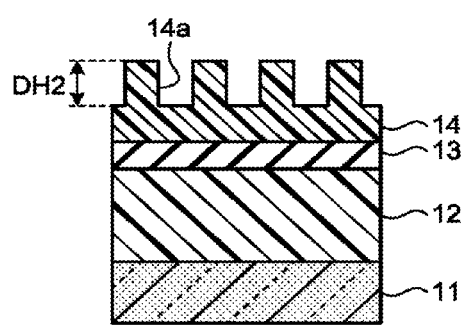

Next, as illustrated in FIG. 3C, the resist material 14 with the latent image 14' is developed to form a resist pattern 14a on the resist material 14. At that time, the EUV light has an exposure depth limit of about 25 nm, and depth DH2 of the resist pattern 14a is about 25 nm.

Figure 3D:
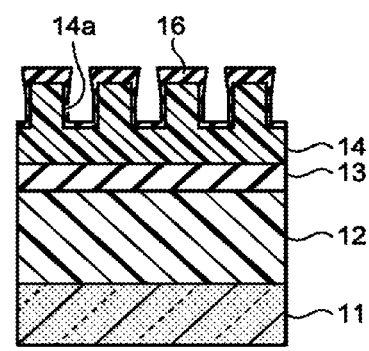

Next, as illustrated in FIG. 3D, a protective film 16 is formed along convexities and concavities of the resist pattern 14a by a method such as CVD. At that time, the protective film 16 may be formed to have an overhang shape and made thicker on the top surface than on the bottom surface of the resist pattern 14a. For example, the ratio of thicknesses of the protective film 16 on the bottom surface to the top surface of the resist pattern 14a may be set to 1 to 2. The material for the protective film 16 may be lower in etch rate than the resist material 14. For example, when the resist material 14 is an organic film, the protective film 16 may be an inorganic film of $SiO_2$ or SiN. The film forming temperature for the protective film 16 may be set to be equal to or lower than the baking temperature for the resist material 14. For example, when the protective film 16 is to be formed from SiN by CVD, the film forming temperature may be set within the range of 70 to 80° C.

Figure 3E:
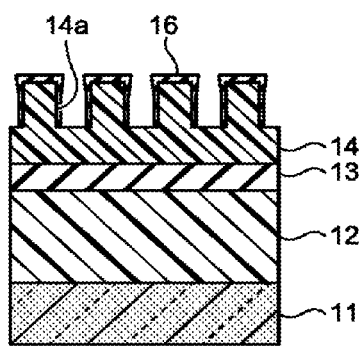

Next, as illustrated in FIG. 3E, the protective film 16 is etched back by anisotropic etching such as RIE. At that time, the protective film 16 may be removed from the bottom surface of the resist pattern 14a while the protective film 16 is left on the top surface of the resist pattern 14a.

Figure 4A:
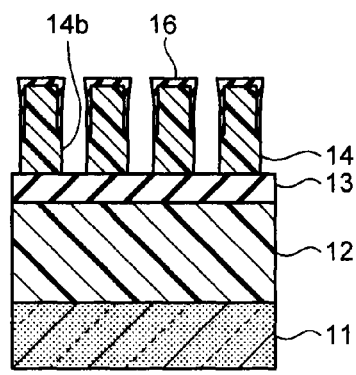
FIGS. 4A to 4D are cross-sectional views illustrating the manufacturing method for a semiconductor device according to the second embodiment.

Next, as illustrated in FIG. 4A, the resist material 14 is etched in the depth direction by anisotropic etching such as RIE to penetrate through the bottom surface of the resist pattern 14a, thereby to form openings 14b in the resist pattern 14a. At that time, covering the top surface of the resist pattern 14a with the protective film 16 makes it possible to set back the bottom surface of the resist pattern 14a without setting back the top surface of the resist pattern 14a. Accordingly, the depth of the resist pattern 14a can be increased beyond the exposure depth limit of the exposure light EX2 while supporting the finer resist pattern 14a.

Figure 4B:
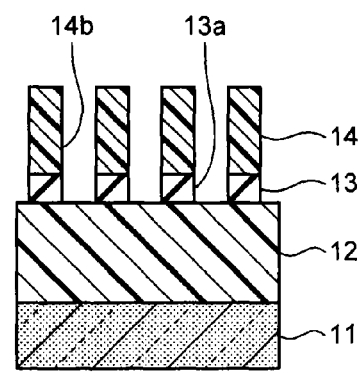

Next, as illustrated in FIG. 4B, the protective film 16 is removed from the resist material 14. Then, the SOG film 13 is etched via the openings 14b to form openings 13a in the SOG film 13. Alternatively, the SOG film 13 may be etched without removal of the protective film 16 from the resist material 14. In that case, however, it is preferred to decide designed dimensions of the resist pattern 14a such that the resist pattern 14a is set back by the film thickness of the protective film 16 in the process of FIG. 3C.

Figure 4C:
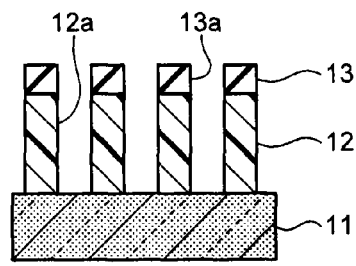

Next, as illustrated in FIG. 4C, the SOC film 12 is etched via the openings 13a to form openings 12a in the SOC film 12.

Figure 4D:
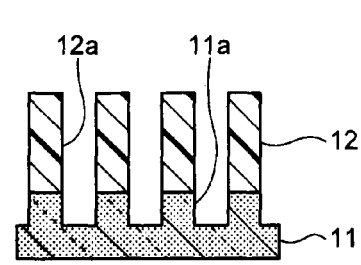

Next, as illustrated in FIG. 4D, the foundation layer 11 is etched via the openings 12a to form openings 11a in the foundation layer 11. The diameter of the openings 11a may be set to 20 nm or less. At that time, the aspect ratio of the openings 11a may be set to 3 or more, and the depth of the openings 11a may be set to 60 nm or more.

Increasing the depth of the resist pattern 14a improves etching resistance of the resist pattern 14a. Accordingly, the aspect ratio of the process pattern can be increased without reducing the dimensional accuracy of the process pattern. By providing the SOC film 12 under the resist material 14, the exposure light EX2 having passed through the resist material 14 can be absorbed in the SOC film 12. Accordingly, it is possible to prevent the exposure light EX2 having passed through the resist material 14 from being reflected and returned to the resist material 14, and improve the exposure accuracy of the resist material 14.

In the foregoing embodiment, the SOC film 12 and the SOG film 13 are formed on the foundation layer 11 to process the foundation layer 11. Alternatively, the SOC film 12 and the SOG film 13 may not be formed on the foundation layer 11 but the foundation layer 11 may be processed with the use of the resist pattern 14a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A pattern forming method, comprising:
    forming a mask material on a processing layer;

forming a mask pattern with a top surface corresponding to a convexity of an upper surface of the mask material and a bottom surface corresponding to a concavity of the upper surface of the mask material, the mask material remaining under the bottom surface of the mask pattern;

forming a protective film on the top surface of the mask pattern; and etching the remaining mask material under the bottom surface of the mask pattern, the protective film remaining on the top surface of the mask pattern.

2. The pattern forming method of claim 1, wherein an etching rate of the protective film is lower than an etching rate of the mask pattern.

3. The pattern forming method of claim 1, wherein the mask pattern is an organic film and the protective film is an inorganic film.

4. The pattern forming method of claim 1, wherein the forming the protective film on the top surface of the mask pattern includes:

forming the protective film along convexities and concavities of the mask pattern in such a manner as to have an overhang shape on the top surface of the mask pattern; and etching the protective film to remove the protective film on the bottom surface of the mask pattern while the protective film is left on the top surface of the mask pattern.

5. The pattern forming method of claim 4, wherein the protective film is thicker on the top surface than on the bottom surface of the mask pattern.

6. The pattern forming method of claim 1, wherein the mask pattern includes a resist pattern.

7. The pattern forming method of claim 6, wherein a film thickness of a resist material of the resist pattern is thicker than an exposure limit of an exposure light with which the resist material is irradiated.

8. The pattern forming method of claim 1, wherein the mask pattern includes an imprint pattern.

9. The pattern forming method of claim 8, wherein
the processing layer has a step, and
the film thickness of the imprint pattern is larger on a lower surface than on an upper surface of the step.

10. The pattern forming method of claim 1, wherein the mask material has a three-layer structure with an SOC film, an SOG film, and an organic film.

11. A manufacturing method for a semiconductor device, comprising:
forming a mask material on a processing layer;
forming a mask pattern with a top surface corresponding to a convexity of an upper surface of the mask material and a bottom surface corresponding to a concavity of the upper surface of the mask material, the mask material remaining under the bottom surface of the mask pattern;

forming a protective film on the top surface of the mask pattern;

etching the remaining mask material under the bottom surface of the mask pattern, the protective film remaining on the top surface of the mask pattern; and etching the processing layer via the mask pattern.

12. The manufacturing method for a semiconductor device of claim 11, wherein an etching rate of the protective film is lower than an etching rate of the mask pattern.

13. The manufacturing method for a semiconductor device of claim 11, wherein the mask pattern is an organic film and the protective film is an inorganic film.

14. The manufacturing method for a semiconductor device of claim 11, wherein the forming the protective film on the top surface of the mask pattern includes:

forming the protective film along convexities and concavities of the mask pattern in such a manner as to have an overhang shape on the top surface of the mask pattern; and etching the protective film to remove the protective film on the bottom surface of the mask pattern while the protective film is left on the top surface of the mask pattern.

15. The manufacturing method for a semiconductor device of claim 14, wherein the protective film is thicker on the top surface than on the bottom surface of the mask pattern.

16. The manufacturing method for a semiconductor device of claim 11, wherein the mask pattern includes a resist pattern.

17. The manufacturing method for a semiconductor device of claim 16, wherein a film thickness of a resist material of the resist pattern is thicker than an exposure limit of an exposure light with which the resist material is irradiated.

18. The manufacturing method for a semiconductor device of claim 11, wherein the mask pattern includes an imprint pattern.

19. The manufacturing method for a semiconductor device of claim 18, wherein
the processing layer has a step, and
the film thickness of the imprint pattern is larger on a lower surface than on an upper surface of the step.

20. The manufacturing method for a semiconductor device of claim 11, wherein the mask material has a three-layer structure with an SOC film, an SOG film, and an organic film.

* * * * *